US011282961B2

(12) United States Patent
Frougier et al.

(10) Patent No.: US 11,282,961 B2
(45) Date of Patent: Mar. 22, 2022

(54) ENHANCED BOTTOM DIELECTRIC ISOLATION IN GATE-ALL-AROUND DEVICES

(71) Applicant: International Business Machines Corporation, Armonk, NY (US)

(72) Inventors: Julien Frougier, Albany, NY (US); Andrew Greene, Slingerlands, NY (US); Ruilong Xie, Niskayuna, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/828,162

(22) Filed: Mar. 24, 2020

(65) Prior Publication Data

US 2021/0305420 A1 Sep. 30, 2021

(51) Int. Cl.
*H01L 29/78* (2006.01)
*H01L 29/66* (2006.01)
*H01L 29/08* (2006.01)
*H01L 29/06* (2006.01)

(52) U.S. Cl.
CPC ........ *H01L 29/785* (2013.01); *H01L 29/0665* (2013.01); *H01L 29/0847* (2013.01); *H01L 29/66795* (2013.01); *H01L 2029/7858* (2013.01)

(58) Field of Classification Search
CPC ...................... H01L 2029/7858; H01L 29/785
See application file for complete search history.

(56) References Cited

U.S. PATENT DOCUMENTS

| | | | |
|---|---|---|---|
| 9,620,590 B1 | 4/2017 | Bergendahl et al. | |
| 9,741,792 B2 | 8/2017 | Cheng et al. | |
| 9,871,099 B2 | 1/2018 | Pranatharthiharan et al. | |
| 9,881,998 B1 | 1/2018 | Cheng et al. | |
| 9,947,804 B1 | 4/2018 | Frougier et al. | |
| 9,984,936 B1 | 5/2018 | Xie et al. | |
| 10,032,867 B1 | 7/2018 | Yeung et al. | |
| 10,170,638 B1 | 1/2019 | Reznicek | |
| 10,256,158 B1 | 4/2019 | Frougier et al. | |
| 10,453,824 B1 | 10/2019 | Mochizuki et al. | |
| 10,720,431 B1 * | 7/2020 | Cheng | H01L 21/3086 |
| 2021/0098631 A1 * | 4/2021 | Fung | H01L 21/823431 |

* cited by examiner

*Primary Examiner* — Changhyun Yi
(74) *Attorney, Agent, or Firm* — Fleit Intellectual Property Law; Thomas S. Grzesik

(57) ABSTRACT

A gate-all-around (GAA) semiconductor device structure and method for forming the same. The GAA structure includes a nanosheet stack disposed over a patterned portion of a substrate, and an encapsulation structure surrounding the patterned portion of the substrate underlying the nanosheet stack. The method for forming the GAA structure includes forming a liner over and in contact with a nanosheet fin, a sacrificial layer disposed below the nanosheet fin, and a patterned portion of a substrate underlying the nanosheet fin. At least one portion of the liner is etched down to the sacrificial layer. The sacrificial layer is removed thereby forming a cavity between the nanosheet fin and the patterned portion of the substrate. An insulting layer is formed within the cavity, where the patterned portion of the substrate within one or more gate regions is encapsulated by the insulting layer and the liner.

20 Claims, 14 Drawing Sheets

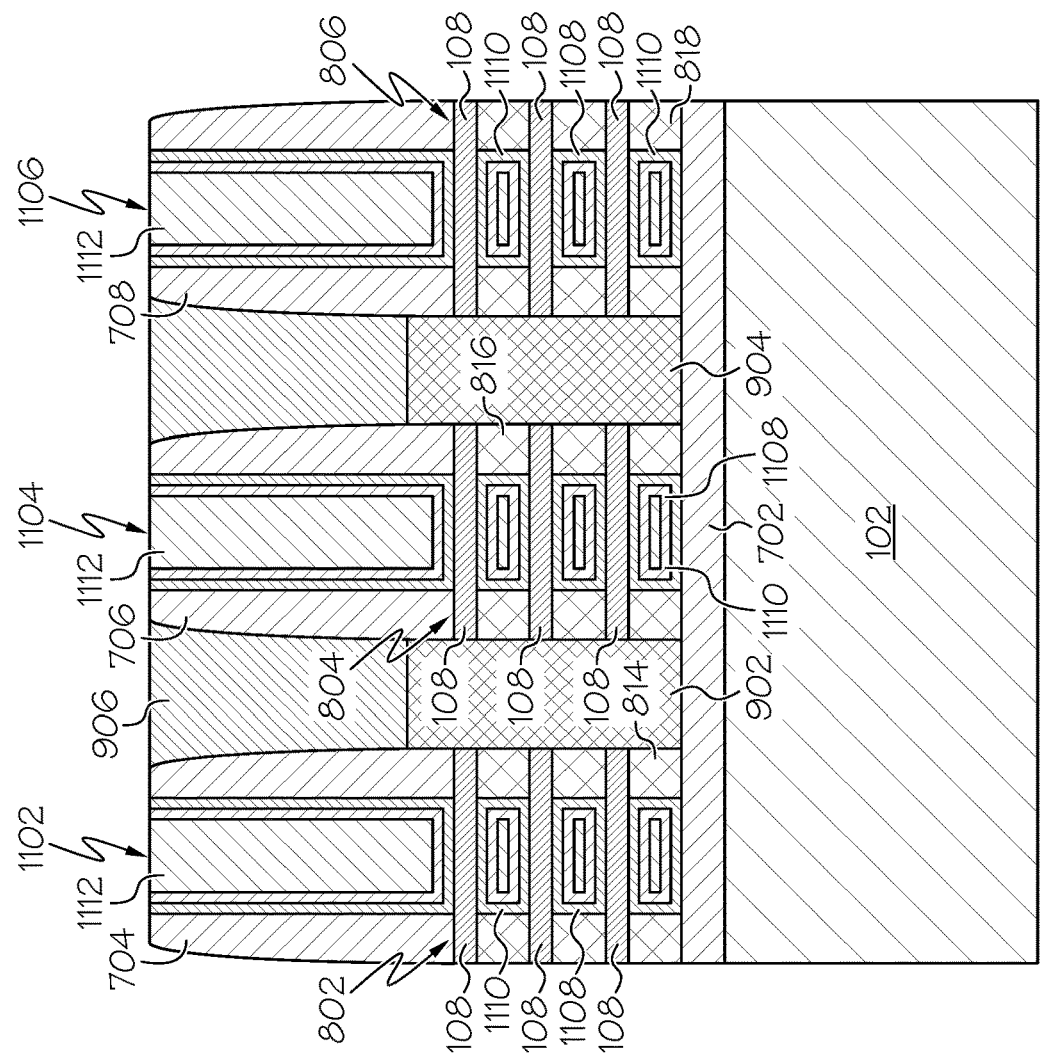
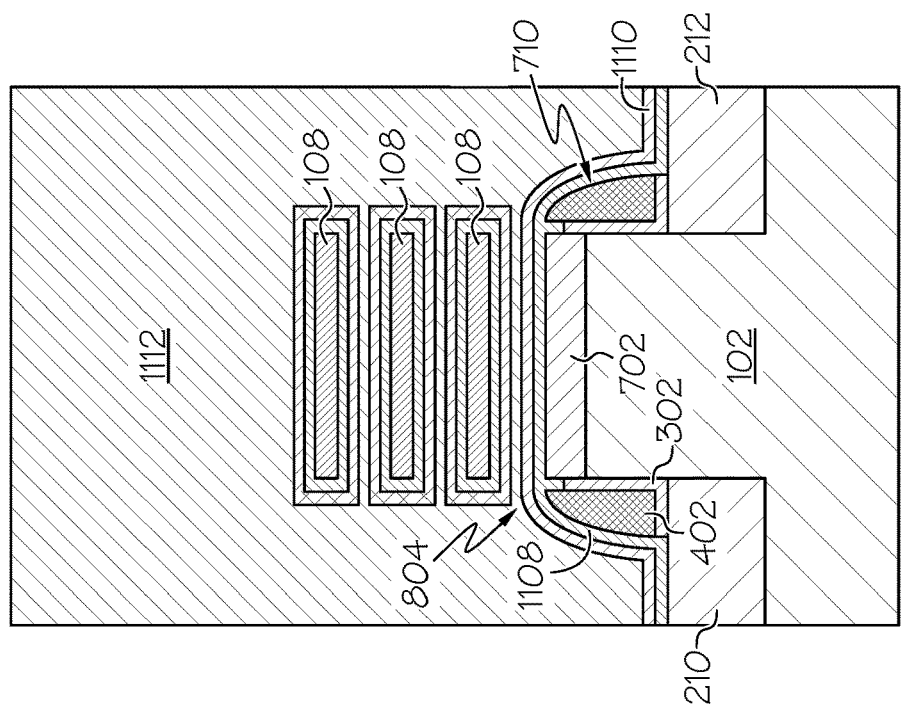
FIG. 11A
FIG. 11B

ENHANCED BOTTOM DIELECTRIC ISOLATION IN GATE-ALL-AROUND DEVICES

BACKGROUND OF THE INVENTION

The present invention generally relates to the field of semiconductors, and more particularly relates to gate-all-around transistors.

As semiconductor devices scale to smaller dimensions, gate-all-around devices such as nanosheet devices provide advantages. For example, gate-all-around devices provide area efficiency and increased drive current within a given layout area. One example of a gate-all-around device is a nanosheet field-effect transistor (FET). Nanosheet FETs are becoming increasingly pursued as a viable semiconductor device option, especially for transistors at smaller scales, e.g., at five nanometer technology (nm) and technologies with even smaller scales. A nanosheet FET transistor typically includes a substrate, a number of vertically stacked nanosheets forming a channel, and a gate. A nanosheet is formed of a thin layer of semiconductor channel material having a vertical thickness that is typically less than a width of the material.

SUMMARY OF THE INVENTION

In one embodiment, a method for forming a gate-all-around semiconductor device structure comprises forming a liner over and in contact with at least one nanosheet fin, a sacrificial layer disposed under the nanosheet fin, and a patterned portion of a substrate underlying the nanosheet fin in a gate region. At least one portion of the liner is etched down to the sacrificial layer. The sacrificial layer is removed thereby forming a cavity between the nanosheet fin and the patterned portion of the substrate. An insulating layer is formed within the cavity, where the patterned portion of the substrate underlying the nanosheet fin is encapsulated by the insulting layer and the liner.

In another embodiment, a gate-all-around semiconductor device structure comprises a nanosheet stack disposed over a patterned portion of a substrate and an encapsulation structure surrounding the patterned portion of the substrate underlying the nanosheet stack.

In a further embodiment, an integrated circuit comprises at least one gate-all-around semiconductor device. The at least one gate-all-around semiconductor device comprises a nanosheet stack disposed over a patterned portion of a substrate and an encapsulation structure surrounding the patterned portion of the substrate underlying the nanosheet stack.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the embodiments of the invention, in which:

FIGS. 8A to 9C are various cross-sectional views of the semiconductor structure after portions of the nanosheet fin within the source/drain regions have been removed according one embodiment of the present invention;

FIGS. 9A to 10C are various cross-sectional views of the semiconductor structure after source/drains and inner spacers have been formed according one embodiment of the present invention;

FIGS. 10A to 10C are various cross-sectional views of the semiconductor structure after sacrificial layers of the nanosheet fin and the disposable gate structures have been removed according one embodiment of the present invention;

FIGS. 11A to 11C are various cross-sectional views of the semiconductor structure after gate structures have been formed according one embodiment of the present invention.

DETAIL DESCRIPTION

Figure 1:
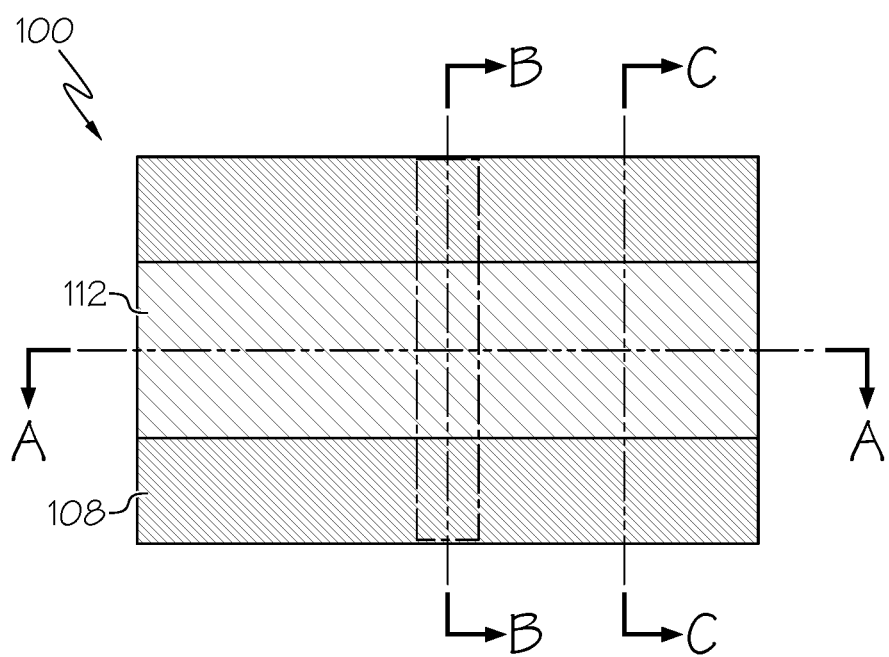
FIG. 1 is a top-down view of a semiconductor structure comprising a nanosheet layers according one embodiment of the present invention.

It is to be understood that the present invention will be described in terms of a given illustrative architecture; however, other architectures, structures, substrate materials, process features, and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. In addition, "vertical dimension", "vertical direction", "horizontal dimension", and "horizontal direction" are to be taken with respect to the substrate surface as oriented in the illustrated figures unless otherwise noted.

The present invention may include a design for an integrated circuit chip, which may be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal may be any process that removes material from the wafer; examples include etch processes (either wet or dry) and chemical-mechanical planarization (CMP).

Patterning refers to the shaping or altering of deposited materials and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

Various embodiments will now be discussed in further detail with regard to semiconductor devices and methods of manufacturing the same and, in particular, to a fabrication method and structure of gate-all-around transistors comprising encapsulation of patterned portions of the substrate underlying the nanosheet fin/stack. Gate-all-around (GAA) field effect transistors (FETs) such as nanosheet devices are a viable device option as CMOS technology continues to scale. Gate-all-around FETs can provide improved electrostatic control when compared to conventional transistor structures for satisfying requirements of aggressive device scaling.

However, downstream fabrication process may progressively erode device isolation regions (e.g., shallow trench isolation regions) and pull these structures down, which results in the exposed portion of the substrate (sub-fin region) under the gate to be covered by high-k metal gate stack during the replacement metal gate fabrication process. High-k metal gate stack material formed on the exposed sub-fin region is undesirable because it introduces extra parasitic capacitance that affects device performance. Increasing the thickness of the BDI layer to avoid deposition of high-k material on the exposed sub-fin region is not a viable option due to how BDI layer are typically formed.

For example, BDI layers are generally fabricated using an epitaxially grown sacrificial silicon germanium (SiGe) layer that is subsequently replaced by a dielectric material. Increasing the thickness of the sacrificial SiGe layer can cause epitaxy defects in the nanosheet stack that propagate upwards to the nanosheet stack causing transistor performance and yield degradation. As will be discussed in greater detail below, embodiments of the present invention overcome these problems by forming an enhanced bottom dielectric isolation structure. This structure fully encapsulates the sub-fin region in both source-drain regions and gate regions and prevents the high-k metal gate stack from contacting the sub-fin region, which minimizes any parasitic capacitance.

Referring now to the drawings in which like numerals represent the same or similar elements, FIGS. 1 to 11C illustrate one or more processes for providing enhanced encapsulation of the fin region under nanosheet stacks. In general, the figures may comprise a top view and various cross-sectional views that are taken where indicated in the top view of FIG. 1. More specifically, cross-sectional views labeled "A" are taken along a line that passes through the long axis of a nanosheet device; cross-sectional views labeled "B" are taken along a line that passes through the short axis of a nanosheet device in the gate region, which is represented by the dashed/dotted rectangle; and cross-sectional views labeled "C" are taken along a line that passes through the short axis of a nanosheet device in the source/drain region.

Figure 1A:
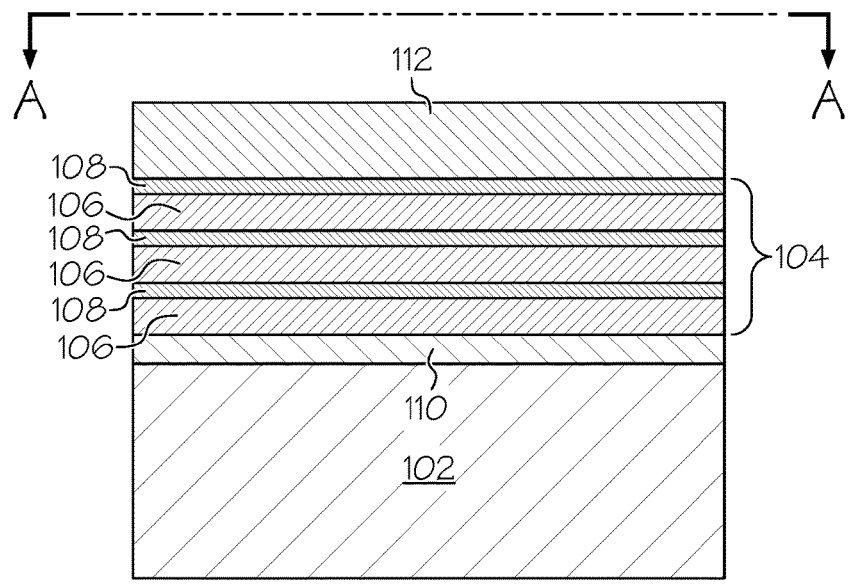
FIGS. 1A to 1C are various cross-sectional views of the semiconductor structure shown in FIG. 1 according one embodiment of the present invention.
Figure 1B:
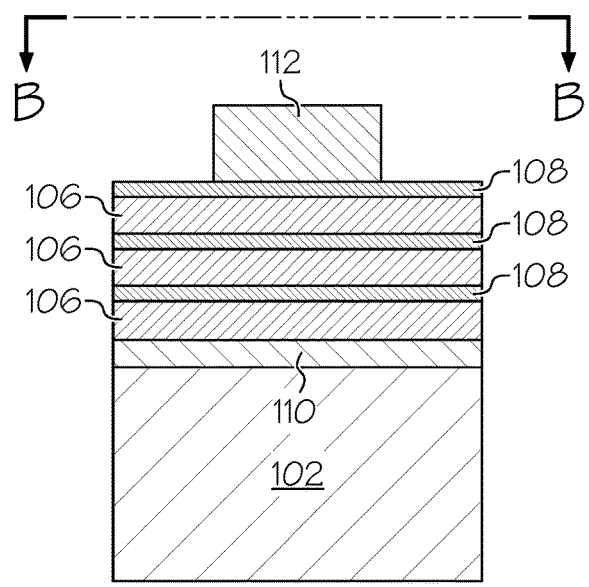
Figure 1C:
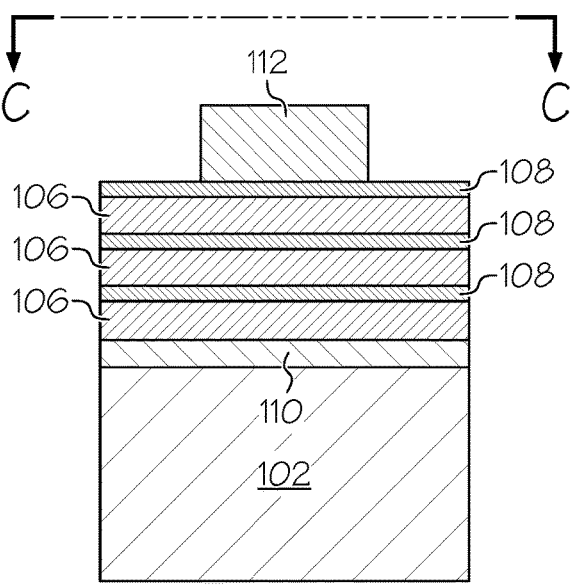

FIGS. 1 to 1C show a semiconductor structure 100 comprising a substrate 102 and a stack 104 of semiconductor material formed thereon. The substrate 102 may be a bulk substrate comprising silicon (Si). However, the substrate 102 may include materials other than or in addition to silicon. For example, the substrate 102 may include a semiconductor material including, but not necessarily limited to, silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. III-V compound semiconductors may have a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). II-VI compound semiconductors may have a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

In addition, multiple layers of the semiconductor materials may be used as the semiconductor material of the substrate. In some embodiments, the substrate 102 includes both semiconductor materials and dielectric materials. The semiconductor substrate 102 may also comprise an organic semiconductor or a layered semiconductor such as, for example, Si/SiGe, a silicon-on-insulator or a SiGe-on-insulator. The semiconductor substrate 102 may be doped, undoped or contain doped regions and undoped regions therein. The semiconductor substrate 102 may have regions with strain and regions without strain therein, or have regions of tensile strain and compressive strain.

In one embodiment, the stack 104 of semiconductor material comprises alternating first (sacrificial) semiconductor material layers 106 and second (channel) semiconductor material layers 108 formed in contact with a bottom sacrificial layer 110. In embodiments, where the substrate 102 is a bulk substrate, the bottom sacrificial layer 110 is formed in contact with the substrate 102. Alternatively, in embodiments where the substrate 102 is an SOI substrate the bottom sacrificial layer 110 is be formed in contact with the insulating layer formed on the substrate 102. In one or more embodiments, the layers 106, 108 of the stack 104 and the bottom sacrificial layer 110 are referred to as nanosheets or nanowires. These terms may be used interchangeable and refer to a sheet or a layer having nanoscale dimensions. A nanosheet may refer to a nanowire with a larger width, and/or nanowire may be used to refer to a nanosheet with a smaller width, and vice versa.

The stacked sacrificial layers 106 and the bottom sacrificial layer 110, in one embodiment, comprise a semiconductor material that can be removed selective to each other and the channel layers 108. As used herein, a "semiconductor material" refers to a material having a conductivity in a range from, for example, $3.0 \times 10^{-4}$ Ohm-cm to $3.0 \times 10^{3}$ Ohm-cm, and includes an intrinsic semiconductor material, a p-doped semiconductor material, an n-doped semiconductor material, or a combination of semiconductor materials having different types of doping.

In one embodiment, the sacrificial layers 106 include a germanium-containing semiconductor material in which the atomic concentration of germanium is greater than 15%. For example, the sacrificial layers 106 may include silicon germanium with a 30% concentration of germanium (Ge) although other concentrations of silicon/germanium are applicable as well. The channel layers 108, in one embodiment, include a silicon-containing semiconductor material in which the atomic concentration of silicon is greater than 80%. For example, the channel layers 108 may include single crystalline silicon or a single crystalline silicon-germanium alloy in which the atomic concentration of germanium is less than 20% although other concentrations of silicon/germanium are applicable as well. The bottom sacrificial layer 110, in one embodiment, includes a germanium-containing semiconductor material in which the atomic concentration of germanium is greater than 15%. For example, the bottom sacrificial layer 110 may include silicon germanium with a 60% concentration of germanium (Ge) although other concentrations of silicon/germanium are applicable as well. The different concentrations of germanium within the stacked sacrificial layers 106 and the bottom sacrificial layer 110 allow the bottom sacrificial layer 110 to be removed selective to the sacrificial layers 106. As will be discussed in greater detail below, the bottom sacrificial layer 110 is utilized to form a bottom dielectric isolation layer (BDI).

The thicknesses of the sacrificial layers 106 and the channel layers 108 may be selected such that the entirety of the epitaxial alignment of the sacrificial layers 106 and the channel layers 108 can be maintained throughout the entirety of the stack. Thus, the thickness of each of the sacrificial layers 106 and the channel layers 108 may be less than the corresponding critical thickness, which is the thickness at which an epitaxial material begins to lose epitaxial registry with the underlying single crystalline layer by developing dislocations. For example, the thickness of each of the sacrificial layers 106 and the channel layers 108 may be in a range from 3 nm to 20 nm, although lesser and greater thicknesses can also be employed.

In some embodiments, the sacrificial layers 106, channel layers 108, and bottom sacrificial layer 110 are formed by a series of epitaxial growth processes. The terms "epitaxial growth", "epitaxial deposition", "epitaxially formed", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a combination thereof, and/or the like. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

In one embodiment, the number of repetitions for a pair of a sacrificial layer 106 and a channel layer 108 may be 2 or greater. In one embodiment, the number of repetitions for a pair of a sacrificial layer 106 and a channel layer 108 is in a range from, and including, 2 to, and including, 100 although other ranges are applicable as well. The stack 104, in one embodiment, begins, at the bottom, with a sacrificial layer 106 or with a channel layer 108. In one embodiment, the stack terminates, at the top, with a sacrificial layer 106 or with a channel layer 108. In some embodiments, an optional cap material layer (not shown) may be formed on top of the sacrificial layers 106 and the channel layers 108. The cap material layer, in one embodiment, includes a dielectric material such as silicon nitride, silicon oxide, or a dielectric metal oxide, and can be formed by chemical vapor deposition (CVD).

Figure 2A:
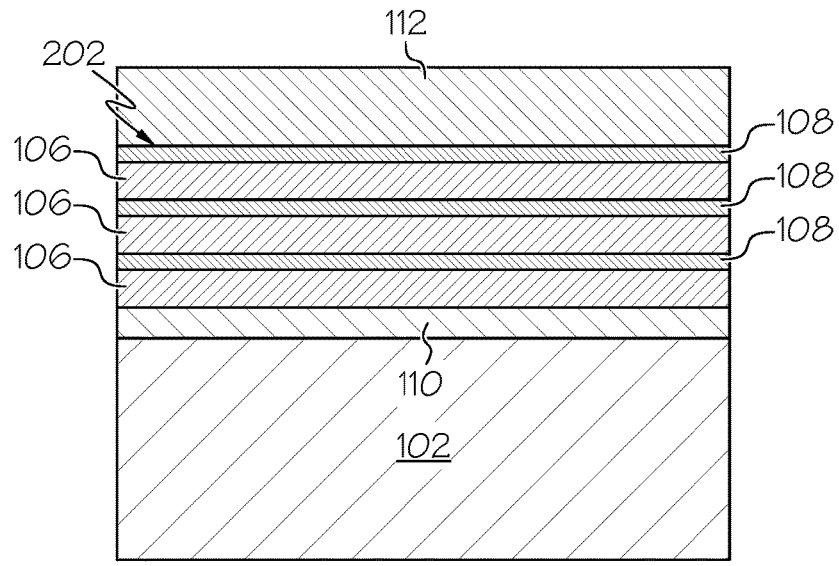
FIGS. 2A to 2C are various cross-sectional views of the semiconductor structure after the nanosheet layers have been patterned into a nanosheet fin/stack and device isolation layers have been formed according one embodiment of the present invention.
Figure 2B:
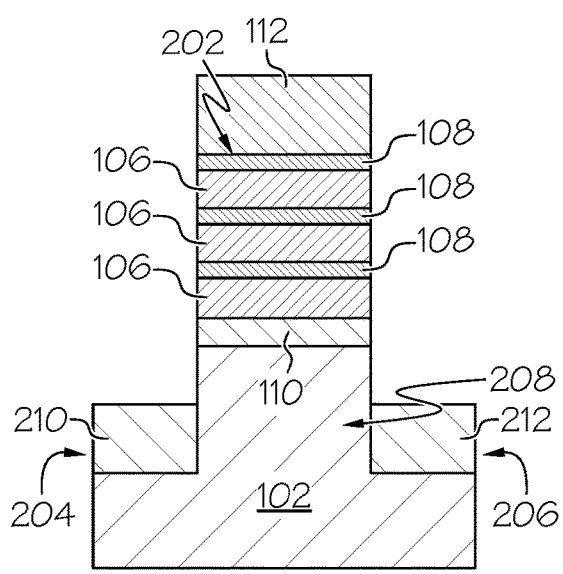
Figure 2C:
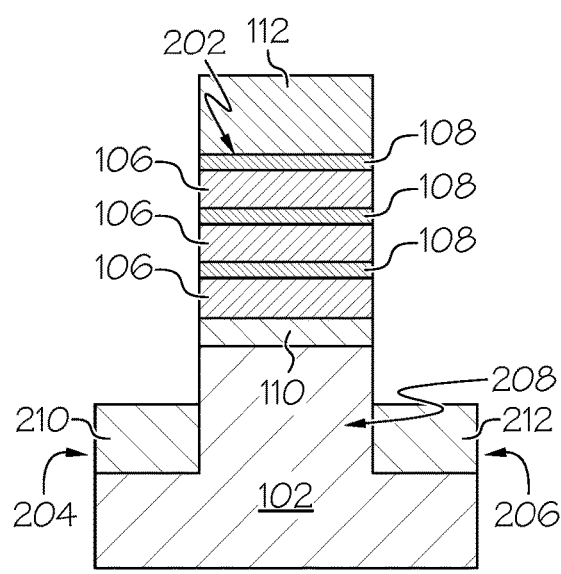

FIGS. 1A to 1C also show one or more mask layers 112 have been formed on the stack 104. In one embodiment, the mask layer(s) is formed by depositing a photoresist or hardmask layer over the top channel layer 108 (or optional cap layer if formed) and lithographically patterned to cover one or more contiguous areas. After the mask layer 112 has been formed, its pattern is transferred through the alternating stack 104 by an anisotropic etch. A remaining portion(s) of the stack 104 of the sacrificial layers 106 and the channel layers 106 constitute a nanosheet stack(s)/fin(s) 202, as shown in FIGS. 2A to 2C. In some embodiments, the nanosheet stack(s) 202 may be a pFET device stack, an NFET device stack, or a combination of both. It should be noted that other processes for forming the nanosheet stack(s)/fin(s) 202 are applicable as well.

In one embodiment the patterning process removes exposed portions of the sacrificial and channel layers 106, 108 and underlying portions of the bottom sacrificial layer 110. The patterning process also recesses portions of the substrate 102 to form isolation regions 204, 206 and a sub-fin structure 208. The sub-fin structure 208 refers to the patterned portion of the substrate 102 underlying the nanosheet fin (stack) 202. The isolation regions 204, 206 are situated adjacent to the sub-fin structure 208 and comprise a top-most surface that is below a top-most surface of the sub-fin structure 208.

Shallow trench isolation (STI) material is deposited within the isolation regions 204, 206 forming an STI layer 210, 212. The STI layer 210, 212 may comprise one or more layers of material. For example, the STI layer 210, 212 may comprise a single layer of oxide or multiple layers such as, but not limited to, a thermal oxide layer, a nitride layer, and another oxide layer. Excess STI material is then removed via chemical-mechanical polishing (CMP), selective etching, and/or the like such that a top-most surface of the STI layer 210, 212 is below a top-most surface of the sub-fin structure 208.

Figure 3A:
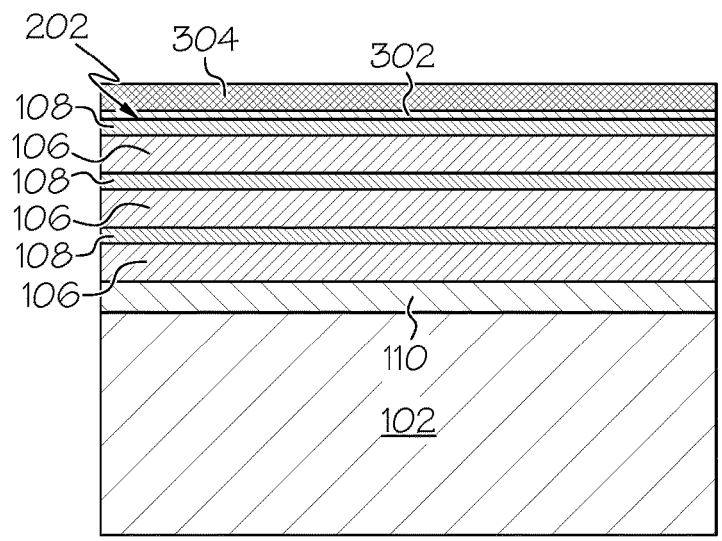
FIGS. 3A to 3C are various cross-sectional views of the semiconductor structure after a multi-layer liner has been formed over the structure according one embodiment of the present invention.
Figure 3B:
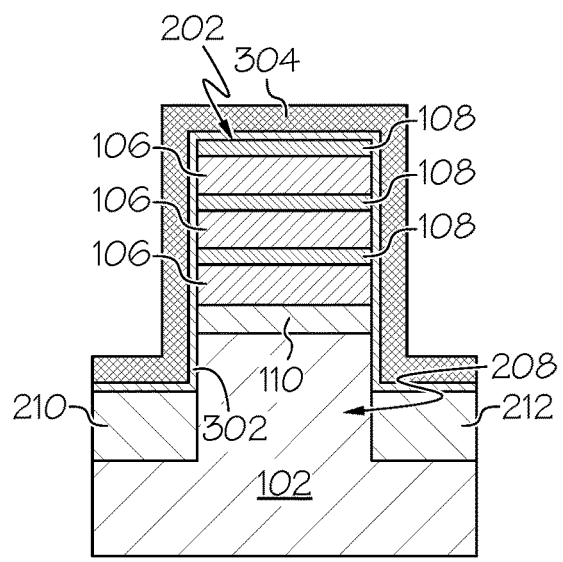
Figure 3C:
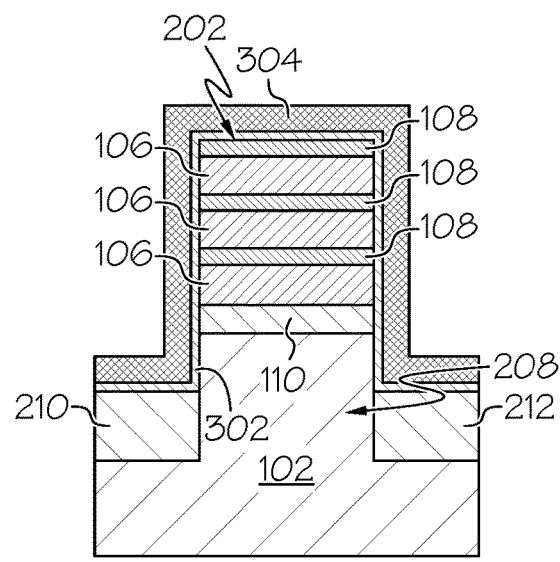

FIGS. 3A to 3C show that after the nanosheet fin(s) 202 and STI layer 210, 212 have been formed, the mask layer 112 is removed and then an oxide layer 302 and liner 304 are formed over the device 100. The mask layer 112 may be removed by one or more stripping processes. This exposes the top surface of the top-most layer of the fin stack 104, which in this example is a channel layer 108. In one embodiment, the oxide layer 302 is formed using one or more conformal deposition processes and comprises one or more materials such as, but not limited to, silicon oxide (SiO2).

The oxide layer 302 contacts a top-most surface of the nanosheet fin 202, the sidewalls of the nanosheet fin 202, exposed sidewall portions of the sub-fin structure 208, and a top-most surface of the STI layer 210, 212. The liner 304, in one embodiment, is formed using one or more conformal deposition process and comprises one or more materials such as, but not limited to, siliconborocarbonitride (SiBCN), silicon oxycarbonitride (SiOCN), silicon oxynitride (SiON), silicon oxycarbide (SiOC), silicon carbide (SiC), and/or the like. The liner 304 is conformally deposited over and in contact with the oxide layer 302. The oxide layer 302 and the liner 304 may be referred to as a dual liner.

Figure 4A:
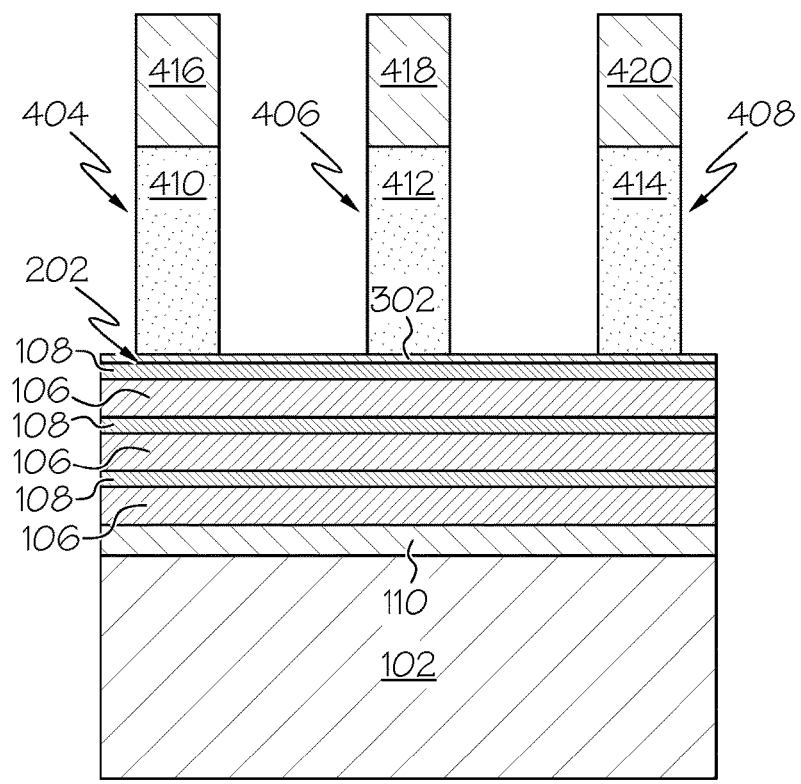
FIGS. 4A to 4C are various cross-sectional views of the semiconductor structure after a first portion of the multi-layer liner has been recessed and disposable gate structures have been formed over gate regions according one embodiment of the present invention.
Figures 4B, 4C:
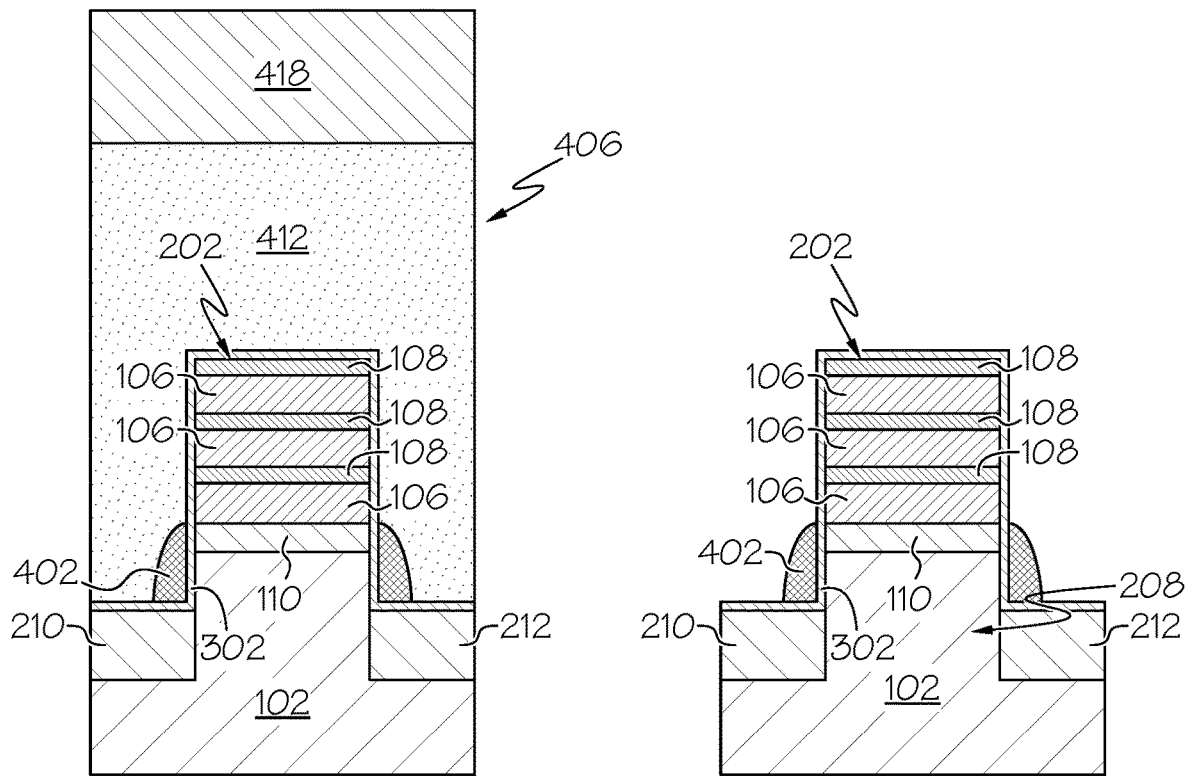

FIGS. 4A to 4C show that the liner 304 is etched to form sub-fin sidewall spacers 402 in the gate region and source/drain regions. For example, an anisotropic reactive ion etching (RIE) process may be performed to selectively remove the liner 304 from horizontal surfaces of the oxide layer 302. The liner 304 may be etched/pulled down to the bottom sacrificial layer 110 as part of the anisotropic etch, which is selective to the oxide layer 302. The oxide layer 302 protects the nanosheet fin 202 during this etching process. The etching/pull-down process results in a portion of the oxide layer 302 above the bottom sacrificial layer 110 and a portion of the oxide layer 302 formed on the STI layer 210, 212 being exposed. The remaining portion of the liner 304 forms a spacer 402 in contact with the oxide layer 302 and surrounding the sidewalls of the sub-fin 208. In some embodiments, the spacer 402 also surrounds sidewalls of the bottom sacrificial layer 110. In one embodiment, the spacer 402 does not extend above the top-most surface of the bottom sacrificial layer 110.

After the spacer 402 is formed, one or more disposable gate structures 404 to 408 are formed over and across (wrapping) portions of the nanosheet fin(s) 202 that will serve as a channel region(s) of the device(s). For example, FIG. 4B shows a disposable gate structure 406 being formed over and surrounding one portion of the nanosheet fin 202 that will serve as a channel region of one device while FIG. 4C shows that another portion of the nanosheet fin 202 where a source/drain is to be subsequently formed has not had a disposable gate structure formed thereon. In some embodiments, a single disposable gate structure may be formed as compared to separate disposable gate structures.

In one embodiment, the disposable gate structures 404 to 408 comprise a disposable gate portion 410 to 414 and a disposable gate cap 416 to 420. The disposable gate portions 410 to 414, in one embodiment, comprise a dielectric material. For example, the disposable gate portions 410 to 414 comprise amorphous carbon, amorphous silicon, diamond-like carbon (DLC), a dielectric metal oxide, silicon nitride, or an organosilicate glass. Alternatively, the disposable gate portions include a stack of a disposable material liner (not shown) and a disposable gate material portion. In this case, the disposable material liner may include a dielectric material such as silicon oxide. The disposable gate material portion, in one embodiment, includes a dielectric material, a semiconductor material, or a conductive material, provided that the disposable gate material portion is able to be removed selective to the dielectric materials of, for example, a planarization dielectric layer and a gate spacer to be subsequently formed.

The disposable gate caps 416 to 420, in one embodiment, may be a single layer or multi-layer cap comprising, for example, a nitride layer, oxide layer, and/or the like. However, in other embodiments, the gate caps 416 to 420 comprise a single layer or more than two layers. The disposable gate structures in one embodiment, may be formed by deposition and patterning of at least one material layer. The patterning of the at least one material layer may be performed by a combination of lithographic methods and an anisotropic etch.

Figure 5A:
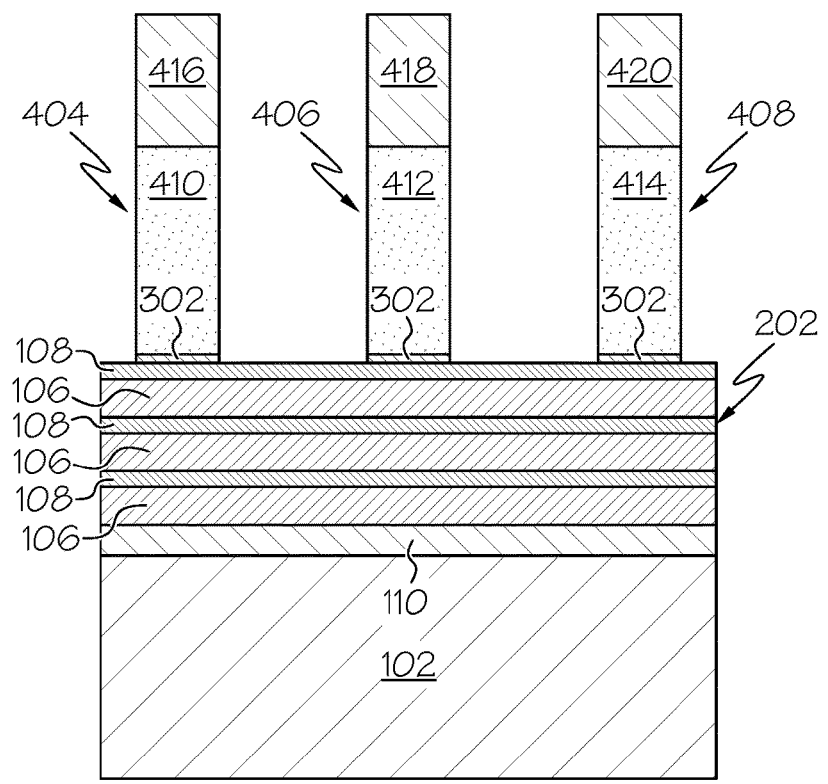
FIGS. 5A to 5C are various cross-sectional views of the semiconductor structure after a the multi-layer liner has been removed from portions of the nanosheet fin in source/drain regions according one embodiment of the present invention.
Figure 5B:
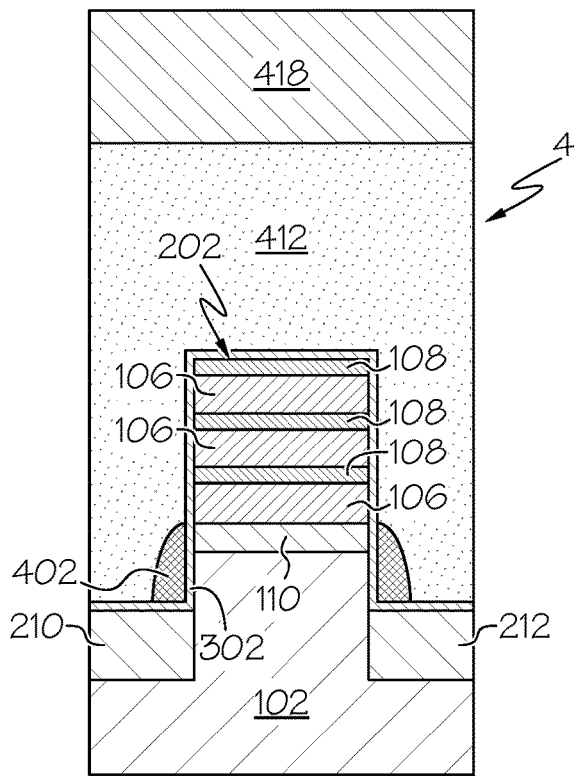
Figure 5C:
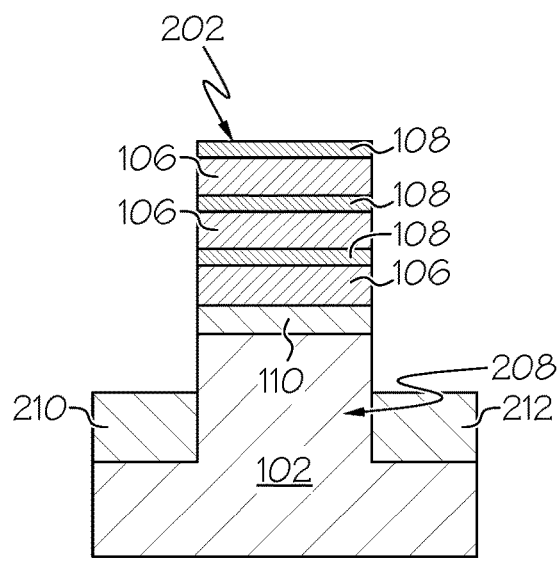

FIGS. 5A to 5C show that after the disposable gate structures 404 to 408 are formed, the spacer 402 is removed from the source/drain area of nanosheet fin 202. For example, the spacer 402 has been removed from source/drain area illustrated in FIG. 5C. A wet etch process can be utilized to remove the spacer 402 from the source/drain areas of the nanosheet fin 202 selective to the oxide layer 302. The spacers 402 in the channel areas of the nanosheet fin 202 are protected during this process by the disposable gate structures 404 to 408.

FIGS. 5A to 5C further show that after the spacers 402 in the source/drain areas have been removed, the oxide layer 302 in the source/drain regions are also removed. An oxide stripping processes such as BHF may be performed to remove the exposed portions of the oxide layer 302. This process leaves separate oxide layers 302 under the disposable gate structures 404 to 408. Removal of the oxide layer 302 from the source/drain regions of the nanosheet fin 202 exposes a top-most surface and sidewalls of the nanosheet stack 104; sidewalls of a portion of the sub-fin structure 208 in the source/drain regions; and portions of the STI layer 210, 212 within the source/drain regions.

Figure 6A:
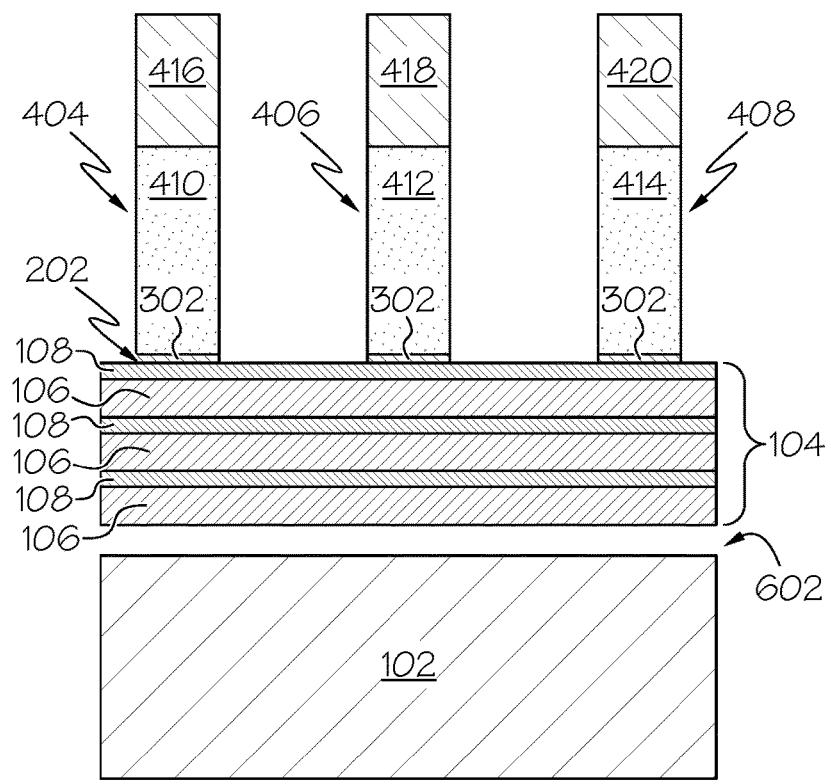
FIGS. 6A to 6C are various cross-sectional views of the semiconductor structure after a sacrificial layer underlying the nanosheet fin has been removed thereby forming a cavity according one embodiment of the present invention.
Figures 6B, 6C:
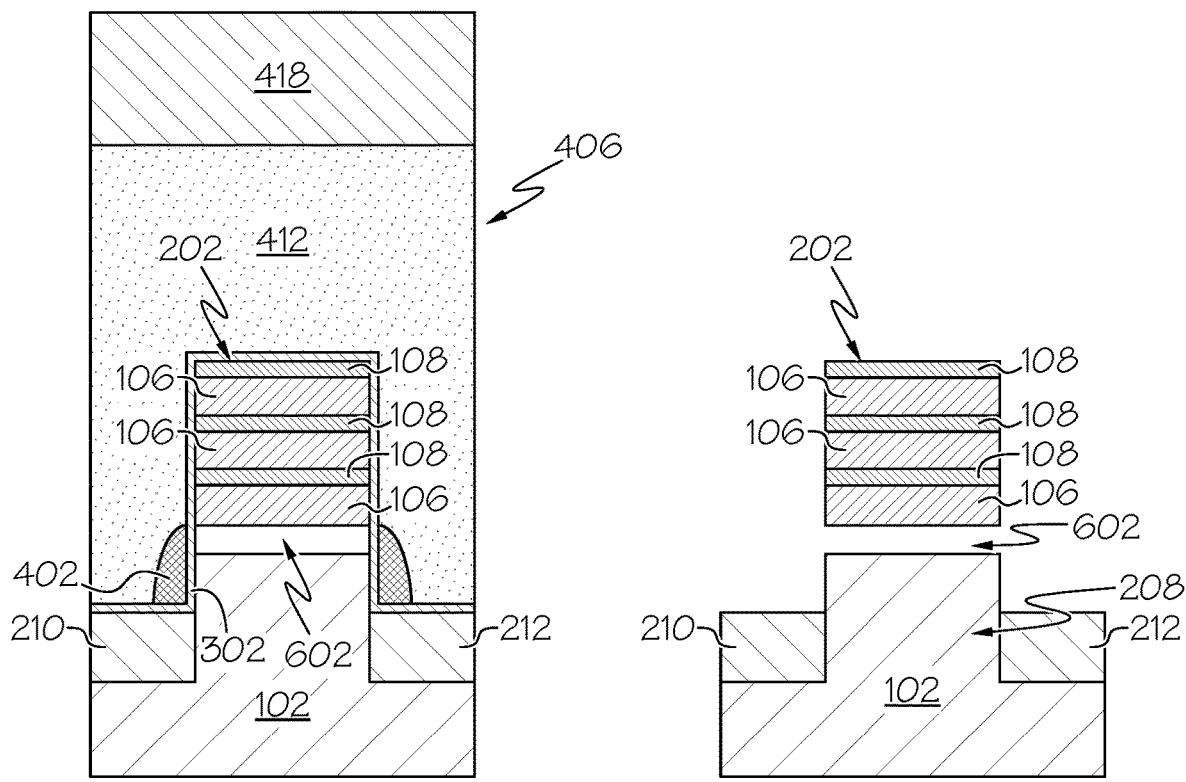

FIGS. 6A to 6C show that a selective etching process is performed to remove the bottom sacrificial layer 110 selective to the sacrificial layers 106 and channel layers 108 of the nanosheet fin 202. For example, an isotropic etch (e.g., wet chemical etch, dry plasma etch, gas phase etch, etc.) can be utilized to selectively remove the bottom sacrificial layer 110. This process forms a cavity 602 between the substrate 102 and the bottom layer of the nanosheet stack 104. The disposable gate structures 404 to 408 act as an anchor for the remaining layers of the nanosheet fin 202 during removal of the bottom sacrificial layer 110.

Figure 7A:
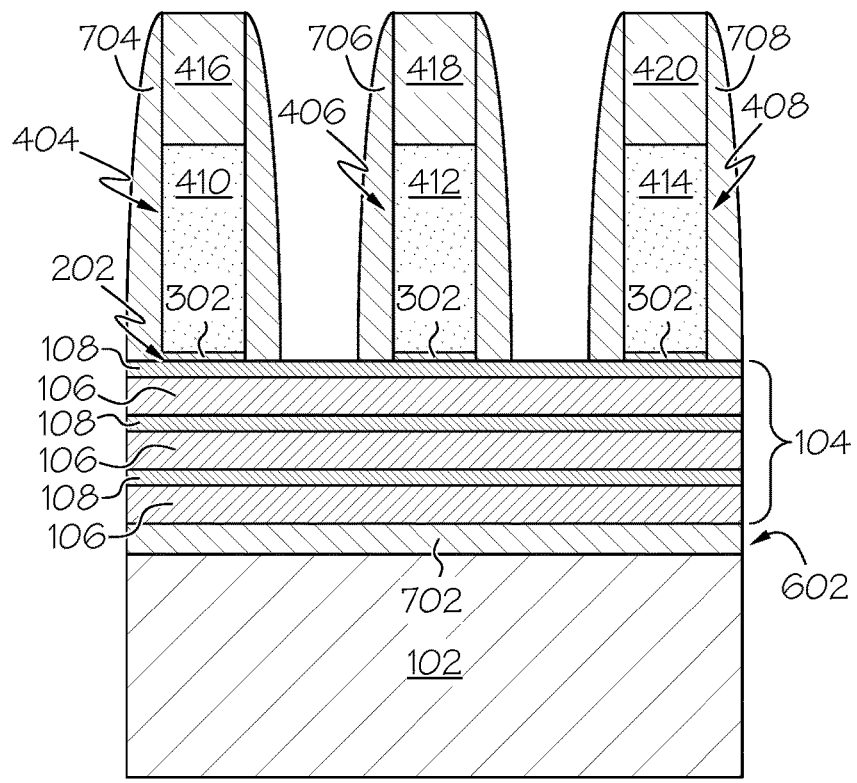
FIGS. 7A to 7C are various cross-sectional views of the semiconductor structure after an insulating layer has been conformally deposited over the structure and subsequently etched according one embodiment of the present invention.
Figure 7B:
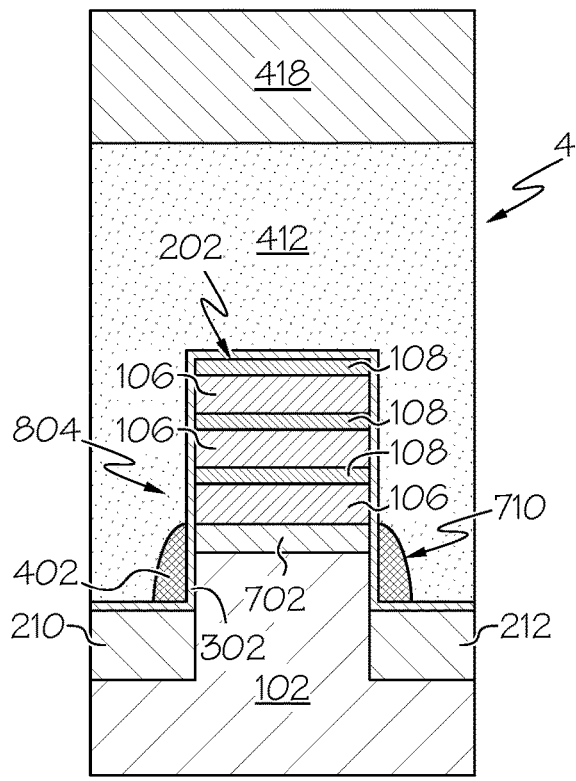
Figure 7C:
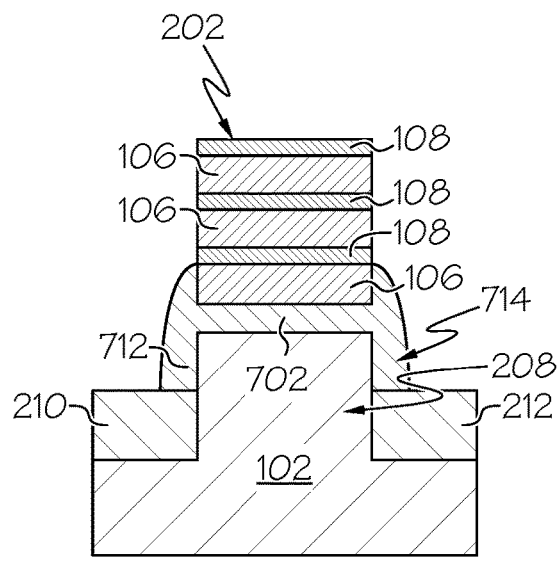

FIGS. 7A to 7C show that a conformal deposition process is performed to deposit an insulating material over the structure 100 to form a BDI layer 702, gate spacers 704 to 708, and a source/drain area sidewall spacer 712. The insulating material is deposited in contact with the disposable gate structures 404 to 408, and further in contact with the exposed portions of the nanosheet fin 202 and sub-fin structure 208 within the source/drain regions. The deposition process also fills the cavity 602 between the substrate 102 and a bottom layer of the nanosheet stack 104. In one embodiment, the conformal deposition process includes ALD or another applicable process. The insulating material, in one embodiment, is a low-k material such as (but not limited to) silicon nitride (SiN), silicon boron carbonitride (SiBCN), silicon oxycarbonitride (SiOCN), silicon oxynitride (SiON), silicon carbide (SiC), and/or the like.

An etching process such as anisotropic spacer RIE is performed to remove the insulating material from horizontal portions of the structure such as the top surface of the disposable gate caps 416 to 420 and the top surface of portions of the nanosheet fin 202 within the source/drain regions. This process also pulls-down portions of the insulating material in contact with sidewalls of the nanosheet fin 202 to the bottom-most layer of the nanosheet fin stack 104 as shown in FIG. 7C.

The above deposition and etching processes form a BDI layer 702 within the cavity 602 and gate spacers 704 to 708 surrounding the disposable gate structures 404 to 408. The BDI layer 702, in one embodiment, contacts a top surface of the substrate 102 and a bottom-most surface of a bottom-most layer (e.g., sacrificial layer 106) of the nanosheet fin stack 104. The spacers 704 to 708, in one embodiment, are gate spacers formed in contact with sidewalls of the disposable gate structures 404 to 408. The combination of the BDI layer 702, sidewall spacer 402, and (subsequently etched) oxide layer 302 in the gate region forms a gate region sub-fin encapsulation structure 710 that prevents unwanted gate dielectric material from contacting the sub-fin structures 208 in the gate regions.

FIG. 7C further shows that the anisotropic spacer RIE process also forms sidewall spacers 712 in contact with the exposed sidewalls of the sub-fin structures 208 in the source/drain regions between or next to the disposable gate structures 404 to 408 and gate spacers 704 to 708. In one embodiment, the insulating material forming the sidewall spacers 712 is etched down in the source/drain regions to a height of at least the BDI layer 702 within the source/drain regions. In other embodiments, the insulating material 702 is etched down to a height that is above a top-most surface of the BDI layer 702. In addition, the insulating material within the source/drain regions may also be removed from at least a portion of the STI layer 210, 212. The combination of the source/drain sidewall spacer 712 and BDI layer 702 forms an encapsulation structure 714 that surrounds and contacts exposed sidewalls and a top-most surface of the sub-fin structure 208 within the source/drain regions.

Figure 8A:
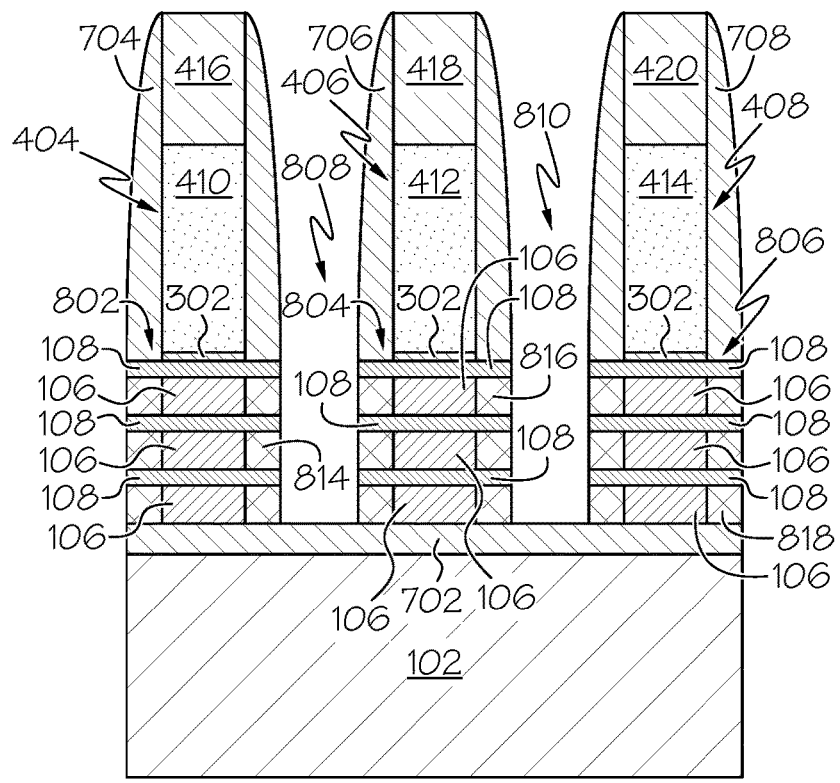
Figures 8B, 8C:
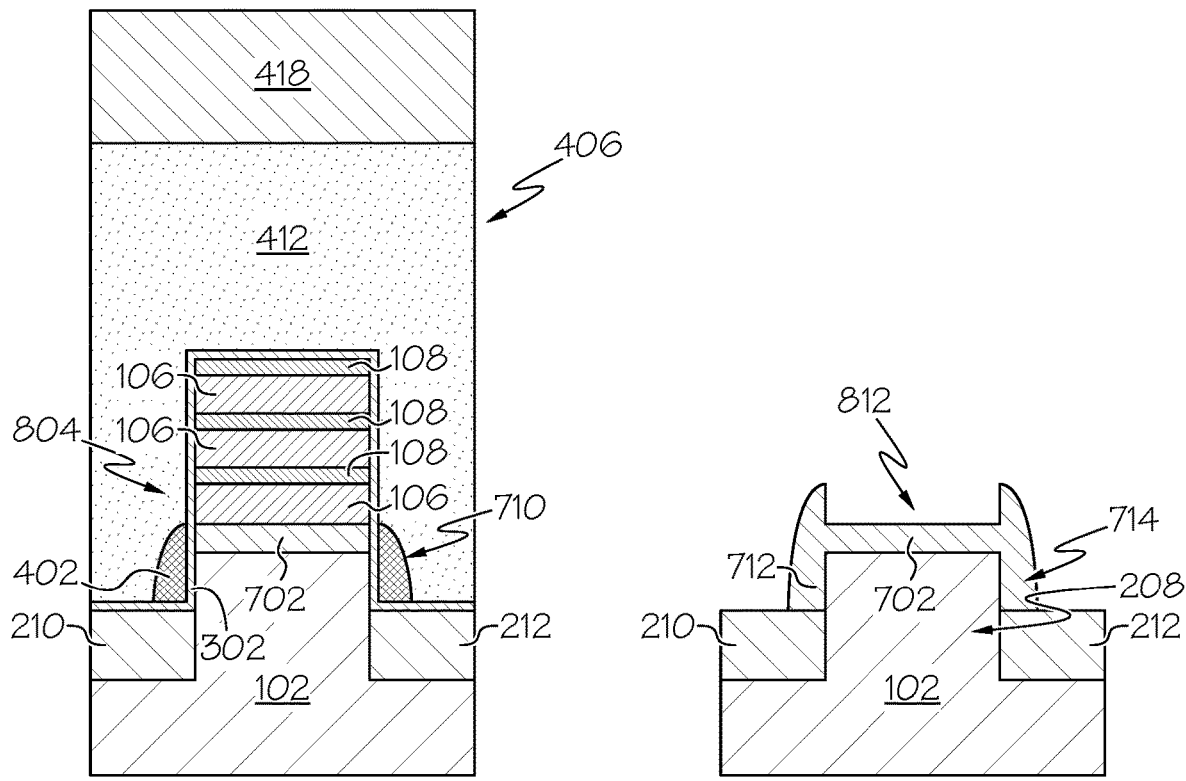

FIGS. 8A to 8C show that after the BDI layer 702, gate spacers 704 to 708, and sidewall spacers 712 have been formed, exposed portions of the nanosheet fin 202 are removed and inner spacers are formed. For example, a directional etching process such as a reactive-ion-etching (RIE) process may be utilized to remove the portions of the nanosheet fin 202 that do not underlie a disposable gate structure 404 to 408 and spacer 704 to 708 (e.g., the portions of the fin 202 within source/drain areas). This etching process results in a plurality of nanosheet fins 802 to 806 being formed and further results in trenches 808, 810 being formed between the neighboring fins 802 to 806. Each of the trenches 808, 810 exposes a portion of the top-most surface of the BDI layer 702; ends of the sacrificial layers 106; and ends of the channel layers 108 within the gate regions. FIG. 8C shows that, in some embodiments, a recessed area 812 is formed between inner sidewalls of the source/drain area sidewall spacer 702 and the top-most surface of the BDI layer 702 where the bottom layer (e.g., bottom-most sacrificial layer 106) of the nanosheet stack 104 was situated.

After portions of the nanosheet fin 202 within the source/drain areas have been removed, inner spacers 814 to 818 formed in contact with sidewalls of the sacrificial layers 106. In one embodiment, the inner spacers 814 to 818 are formed by removing a portion of the sacrificial layers 106 to reduce their size in at least one lateral dimension (i.e., length, width). The portion of the sacrificial layers 106 may be removed using an isotropic etch (e.g., wet chemical etch, non-directional dry plasma etch, etc.), where the isotropic etch etches laterally into the sacrificial layers 106. The isotropic etch may remove a predetermined amount of material from the sacrificial layers 106, where the etch may be a timed etch to uniformly remove an equal amount of material from each exposed end. The isotropic etch may form indentations having a predetermined indentation depth into the sacrificial layers. After the etching process, the channel layers 108 may extend past the sacrificial layers 106 by a predetermined distance. Each of the indentations may extend into the area below the disposable gate spacers 704 to 708.

A deposition process such as ALD, PEALD, CVD, PECVD, or combinations thereof, may be performed to conformally deposit the inner spacer material within the indentations and form the inner spacers 814 to 818. Portions of the inner spacers 814 to 818 that extend out beyond the disposable gate spacers 704 to 708 may be removed by an isotropic etch. In one or more embodiments, the inner spacers 814 to 818 may comprise silicon nitride (SiN), a silicon oxide (SiO), silicon oxynitride (SiON), silicon oxycarbide (SiOC), a silicon boro carbonitride (SiBCN), a silicon oxy carbonitride (SiOCN), a silicon carbide (SiC), a high-k metal oxide, a low-k insulator, or suitable combinations thereof.

Figure 9A:
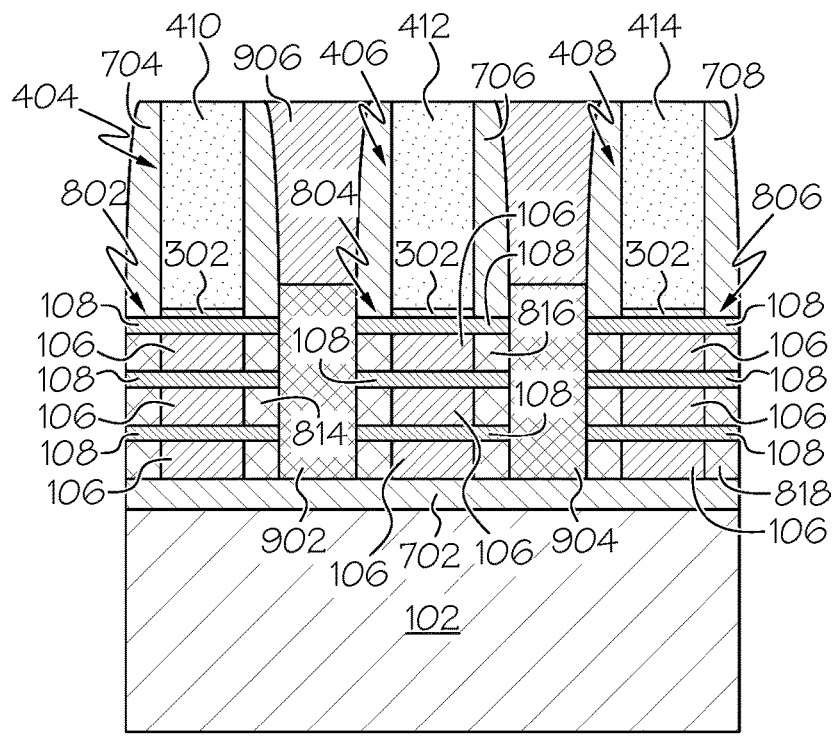
Figure 9B:
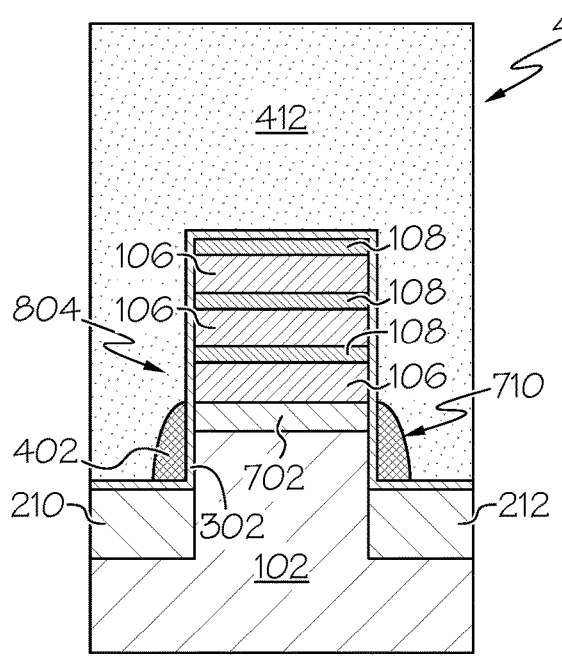
Figure 9C:
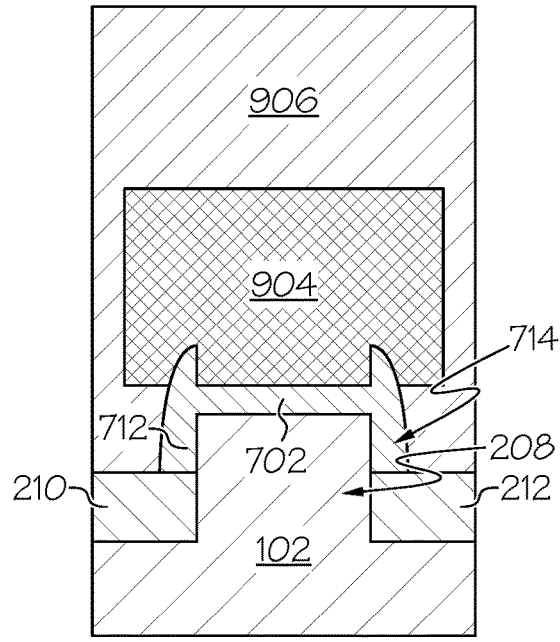

FIGS. 9A to 9C show that a selective epitaxy process may then be performed to form source and drain regions 902, 904. In one embodiment, the ends of the sacrificial layers 106 and/or the ends of the channel layers 108 of the nanosheet fins 802 to 806 may be used as seeds for the epitaxy process. During the selective epitaxy process, a semiconductor material is deposited only on semiconductor surfaces, and does not nucleate on dielectric surfaces. The source region 902 grows from surfaces of the sacrificial layers 106 and/or the channel layers 108 located on one side of the disposable gate structures 404 to 408. The drain region 904 grows from surfaces of the sacrificial layers 106 and/or the channel layers 108 located on the other side of the disposable gate structures 404 to 408. FIG. 9C shows that, in one embodiment, the source/drain layers 902, 904 fill in the recessed area 812 of the source/drain area encapsulation structure 714 formed by the BDI layer 702 and the source/drain area sidewall spacer 712.

Each of the source and drain regions 902, 904, in one embodiment is single crystalline, and is epitaxially aligned to the single crystalline structure of the vertical stack of the sacrificial layers 106 and the channel layers 108. The source and drain regions 902, 904, in one embodiment, may be formed with in-situ doping of the electrical dopants, or by deposition of an intrinsic semiconductor material and subsequent introduction of electrical dopants by ion implantation, plasma doping, gas phase doping, or out-diffusion from a disposable doped silicate glass layer. In one embodiment, activation of the dopants forms a sharp junction. It should be noted that one or more embodiments are not limited to the process discussed above for forming the source and drain regions 902, 904.

FIGS. 9A to 9C further show that an inter-layer dielectric (ILD) layer 906 may then be deposited over the nanosheet fins 802 to 806; disposable gate structures 404 to 408; and source/drains 902, 904. The ILD layer may comprise silicon oxide, oxynitride, or other suitable materials. A planarization process is performed to planarize the ILD down to be coplanar with a top of the disposable gate structures 404 to 408 thereby removing the disposable gate caps 416 to 420. The planarization process may include a chemical mechanical polishing (CMP) process.

Figure 10A:
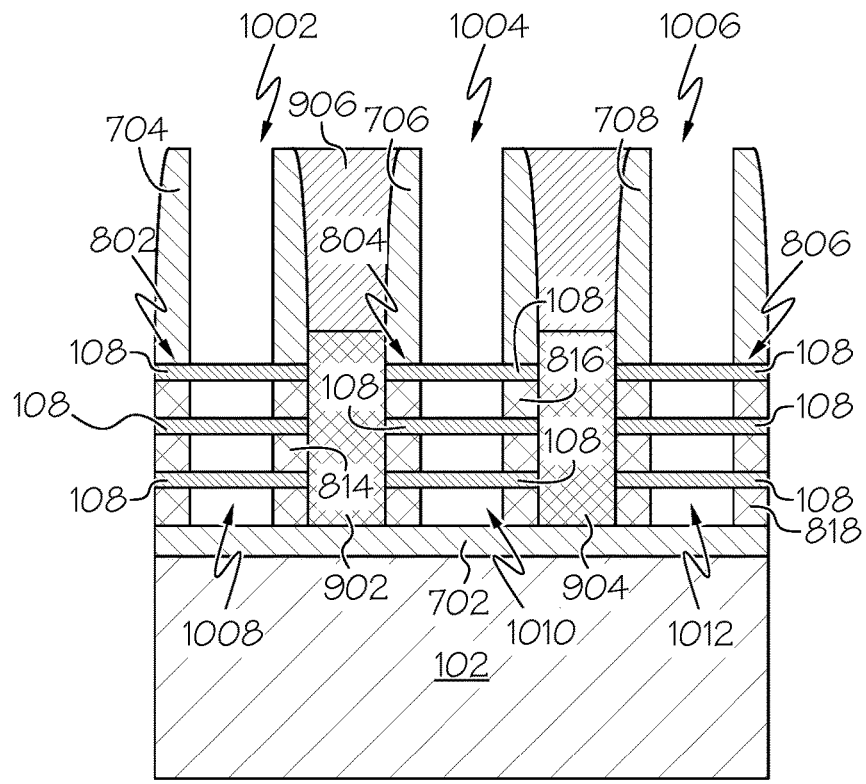
Figure 10B:
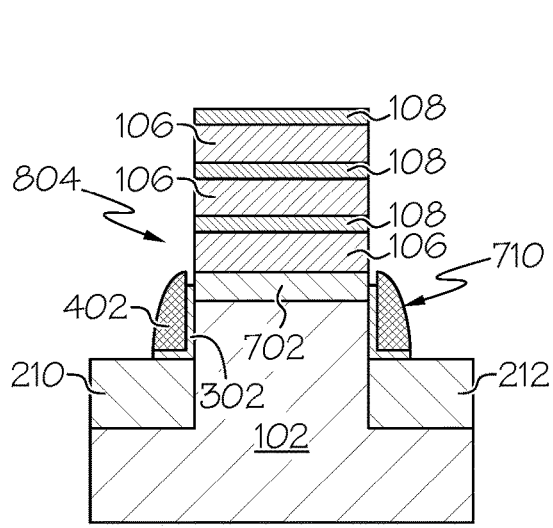
Figure 10C:
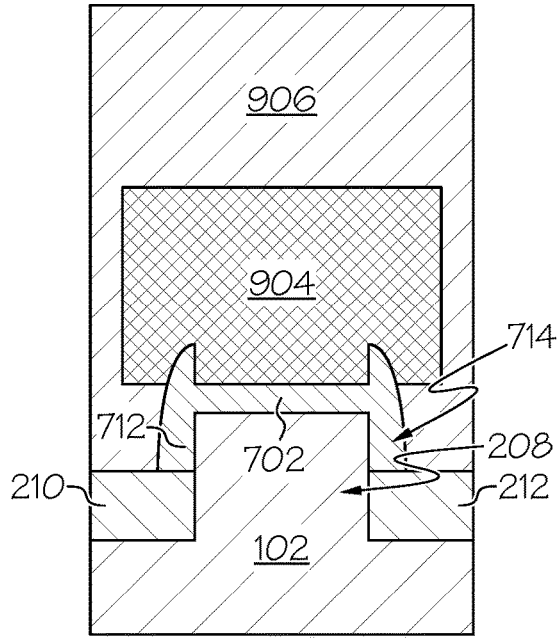

FIGS. 10A to 10C show that after the planarization process has completed, the disposable gate structures 404 to 408; portions of the oxide layers 302; and the sacrificial layers 106 are removed for subsequent formation of replacement gate structures. The disposable gate structures 404 to 408, in one embodiment, are removed via selective etching. The selective etching process may include, for example, an isotropic etch and/or an anisotropic etch. A gate cavity 1002 to 1006 may be formed in the volume from which the disposable gate structure structures 404 to 408 were removed. A portion of the top-most surface of the top/upper most layer of each nanosheet fin 802 to 806 is exposed within its corresponding gate cavity 1002 to 1006. Inner sidewall surfaces of the gate spacers 704 to 708 are also exposed within the gate cavities 1002 to 1006.

In one embodiment, the exposed portions of the oxide layers 302 in contact with the top-most surface of the top/upper most layer of each nanosheet fin 802 to 806; the exposed portions of the oxide layers 302 in contact with the sidewalls of each nanosheet fin 802 to 806; and the exposed portions of the oxide layers 302 in contact with the STI layer 210, 212 are removed as well. These portions of the oxide layer 302 may be removed using a dry etch such as, for example, COR (chemical oxide removal) or a wet chemical etch which may employ an aqueous solution containing hydrofluoric acid (HF). However, portions of the oxide layer 302 within the gate regions and in contact with the sub-fin structure 208 are prevented from being etched away by the gate region encapsulation structure 710 formed by the combination of the gate region sidewall spacer 712 and BDI layer 702.

The sacrificial layers 106, in one embodiment, are removed selective to the channel layers 108 of each nanosheet fin 802 to 806. For example, a wet etch process or a reactive ion etch process, a dry plasma etch, or a gas phase etch can be utilized to selectively remove the sacrificial layers 106 of the nanosheet fins 802 to 806. This process forms cavities 1008 to 1012 between each of the channel layers 108 of the nanosheet fins 802 to 806, which are anchored by the epitaxy material of the source/drain regions 902, 904.

Figure 11C:
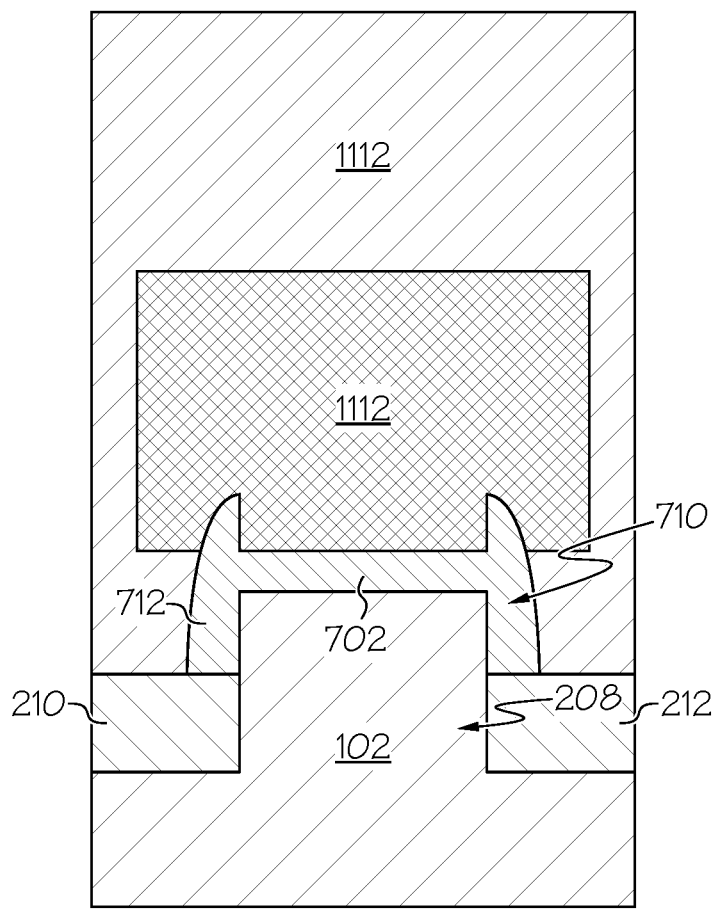

A replacement gate fabrication process may then be performed as shown in FIGS. 11A to 11C. This process forms one or more replacement gates within the gate cavities 1002 to 1006 and surrounding the nanosheet channels 108. For example, a gate dielectric layer 1108 may be formed in contact with and surrounding/wrapping the channel layers 108 of the nanosheet fins 802 to 806. The dielectric layer 1108 separates the nanosheet channels from a subsequently formed work function layer/gate electrode. The gate dielectric layer 1108 may also formed on and in contact with one or more of a top surface the BDI layers 702; any exposed portion of BDI sidewalls; inner sidewalls of the inner spacers 814 to 818; the inner sidewall surfaces of the gate spacers 704 to 708; the top surface of the gate spacers 704, 708; and a top surface of the ILD 906. The dielectric layer may be formed/depositing by a conformal deposition process such as ALD. The gate region encapsulation 710 structure prevents the dielectric material from contacting the sub-fin structure 208 in the gate region, which minimizes any parasitic capacitance caused by high-k metal gate stack with the sub-fin structure 208.

By way of example, in the case of a metal gate, a suitable gate dielectric may be an insulating dielectric layer such as a high-k dielectric, or a suitable combination of these materials. The term "high-κ" as used herein refers to a material having a relative dielectric constant κ which is much higher than that of silicon dioxide (e.g., a dielectric constant κ=25 for hafnium oxide rather than 4 for silicon dioxide. High-K dielectric materials may include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also applicable as well. The stoichiometry of the high-K compounds can vary.

In one embodiment, an nFET and/or pFET work function layer 1110 is then be formed on and in contact with the gate dielectric layer 1108. The work function layer may be formed, for example, by conformally depositing a work function metal on and in contact with the gate dielectric layer 1108 using a process such as ALD. The work function layer 1110 may be formed in contact with and surrounding/wrapping the gate dielectric layer 1110 encompassing the channel layers 108 of the nanosheet fins 802 to 806.

In various embodiments, the work function layer(s) 1110 may be any suitable material, including but not limited a nitride, such as (but not limited to) titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof; and/or the like. The WFM may be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

After the work function layer 1110 has been formed an optional metal fill process may be performed to form a conductive gate electrode 1112. This process fills the gate cavities 1002 to 1006 and any cavities 1008 to 1012 between the channel layers 108 with a conductive gate electrode material(s). By way of example only, in the case of a metal gate, a combination of gate metals may be used that constitute the gate conductor 1112. The gate conductor 1112 may comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, any suitable combination of these materials, and/or the like.

The conductive material may further comprise dopants that are incorporated during or after deposition. The resulting gate structure 1102 to 1106 may be referred to a gate-all-around (GAA) configuration since the gate surrounds/wraps one or more of the channel layers 108. A planarization process such as CMP may be performed to planarize and remove excess dielectric, work function, and gate electrode material from the top surface of the structure 100. Subsequent fabrication processes such as gate cap formation and contact formation may then be performed.

Figure 12:
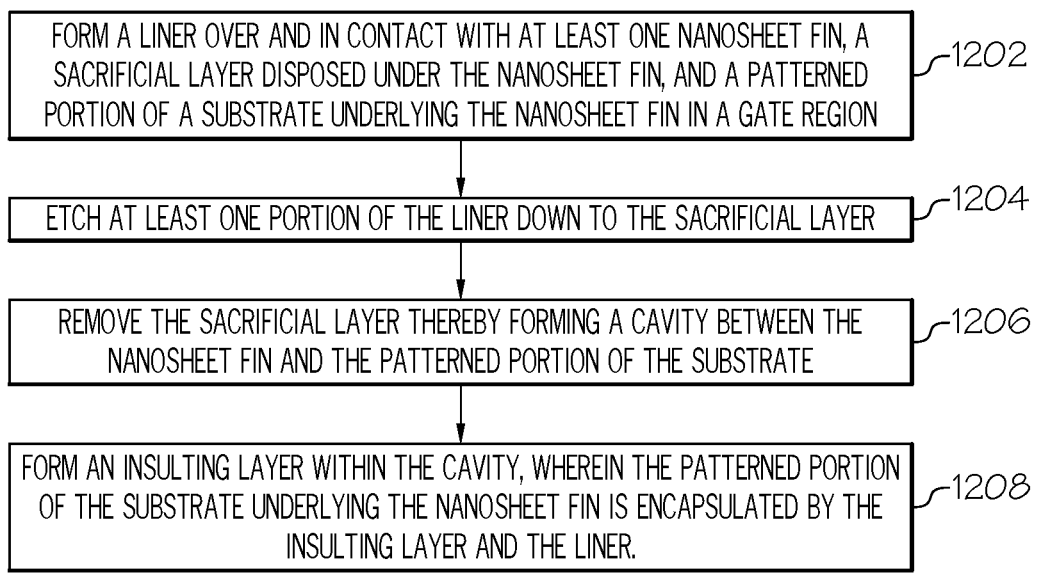
FIG. 12 is an operational flow diagram illustrating one process for forming a gate-all-around semiconductor device structure according one embodiment of the present invention.

FIG. 12 is an operational flow diagram illustrating one example of a process for forming a gate-all-around semiconductor device. It should be noted that each of the steps shown in FIG. 12 have been discussed in greater detail above with respect to FIGS. 1 to 11C. A liner, at step 1202, is formed over and in contact with at least one nanosheet fin, a sacrificial layer disposed under the nanosheet fin, and a patterned portion of a substrate underlying the nanosheet fin in a gate region. At least one portion of the liner, at step 1204, is etched down to the sacrificial layer. The sacrificial layer, at step 1206, is removed thereby forming a cavity between the nanosheet fin and the patterned portion of the substrate. An insulating layer, at step 1208, is formed within the cavity, where the patterned portion of the substrate underlying the nanosheet fin is encapsulated by the insulting layer and the liner.

Although specific embodiments of the invention have been taught, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed embodiments. Moreover, some statements may apply to some inventive features but not to others.

What is claimed is:

1. A gate-all-around semiconductor device structure comprising:
    a nanosheet stack disposed over a patterned portion of a substrate; and
    an encapsulation structure comprising a plurality of layers and surrounding the patterned portion of the substrate underlying the nanosheet stack including a portion of the substrate directly under the nanosheet stack, wherein the plurality of layers of the encapsulation structure are absent from the nanosheet stack.

2. The gate-all-around semiconductor device structure of claim 1, wherein the encapsulation structure is disposed within both a source/drain region and a gate region.

3. The gate-all-around semiconductor device structure of claim 1, wherein the encapsulation structure comprises:
    an insulation layer disposed on a top surface of the patterned portion of the substrate; and
    a liner disposed on sidewalls of the patterned portion of the substrate.

4. The gate-all-around semiconductor device structure of claim 3, wherein the liner contacts sidewalls of the insulation layer and a top surface of a device isolation layer.

5. The gate-all-around semiconductor device structure of claim 3, wherein the liner is a multi-layer liner comprising at least two different layers.

6. The gate-all-around semiconductor device structure of claim 1, further comprising:
    a device isolation layer disposed in contact with a recessed portion of the substrate, sidewalls of the patterned portion of the substrate, and a bottom surface of the encapsulation structure.

7. The gate-all-around semiconductor device structure of claim 1, further comprising:
    a gate structure surrounding channels layers of the nanosheet stack and contacting the encapsulation structure, wherein the encapsulation structure prevents the gate structure from contacting the patterned portion of the substrate.

8. The gate-all-around semiconductor device structure of claim 1, further comprising:
    an additional encapsulation structure surrounding another patterned portion of the substrate; and
    a source/drain disposed in contact with the additional encapsulation structure.

9. The gate-all-around semiconductor device structure of claim 8, wherein the encapsulation structure comprises multiple layers and the additional encapsulation structure comprises a single layer.

10. An integrated circuit comprising:
    at least one gate-all-around semiconductor device, wherein the at least one gate-all-around semiconductor device comprises:
        a nanosheet stack disposed over a patterned portion of a substrate; and
        an encapsulation structure comprising a plurality of layers and surrounding the patterned portion of the substrate underlying the nanosheet stack including a portion of the substrate directly under the nanosheet stack, wherein the plurality of layers of the encapsulation structure are absent from the nanosheet stack.

11. The integrated circuit of claim 10, wherein the encapsulation structure comprises:
    an insulation layer disposed on a top surface of the patterned portion of the substrate; and
    a liner disposed on sidewalls of the patterned portion of the substrate.

12. The integrated circuit of claim 11, wherein the liner contacts sidewalls of the insulation layer and a top surface of a device isolation layer.

13. The integrated circuit of claim 11, wherein the liner is a multi-layer liner comprising at least two different layers.

14. A gate-all-around semiconductor device structure comprising:
    a nanosheet stack disposed over a first patterned portion of a substrate;
    a source/drain disposed over a second patterned portion of the substrate;
    a first encapsulation structure surrounding the first patterned portion of the substrate underlying the nanosheet stack including a portion of the substrate directly under the nanosheet stack; and
    a second encapsulation structure surrounding the second patterned portion of the substrate underlying the source/drain, wherein the second encapsulation structure contacts the source/drain.

15. The gate-all-around semiconductor device structure of claim 14, wherein the second encapsulation structure contacts the top surface of the second patterned portion of the substrate and at least a portion of the bottom surface of the source/drain.

16. The gate-all-around semiconductor device structure of claim 14, wherein the first encapsulation structure comprises a plurality of layers, and wherein the plurality of layers is absent from the nanosheet stack.

17. The gate-all-around semiconductor device structure of claim 14, wherein the first encapsulation structure comprises:
    an insulation layer disposed on a top surface of the first patterned portion of the substrate; and
    a liner disposed on sidewalls of the first patterned portion of the substrate.

18. The gate-all-around semiconductor device structure of claim 17, wherein the liner contacts sidewalls of the insulation layer and a top surface of a device isolation layer.

19. The gate-all-around semiconductor device structure of claim 17, wherein the liner is a multi-layer liner comprising at least two different layers.

20. The gate-all-around semiconductor device structure of claim 14, further comprising:
 a device isolation layer disposed in contact with a recessed portion of the substrate, sidewalls of the first patterned portion of the substrate, and a bottom surface of the first encapsulation structure.

* * * * *